United States Patent
Arnold

(10) Patent No.: US 7,355,164 B2
(45) Date of Patent: Apr. 8, 2008

(54) TOUCH-SENSITIVE MOMENTARY-CONTACT SWITCH AND CONTROL DEVICE HAVING THE MOMENTARY-CONTACT SWITCH

(75) Inventor: Georg Arnold, Schwabach (DE)

(73) Assignee: Diehl AKO Stiftung & Co. KG, Wangen (DE)

( * ) Notice: Subject to any disclaimer, the term of this patent is extended or adjusted under 35 U.S.C. 154(b) by 250 days.

(21) Appl. No.: 11/123,776

(22) Filed: May 5, 2005

(65) Prior Publication Data

US 2005/0252754 A1 Nov. 17, 2005

(30) Foreign Application Priority Data

May 12, 2004 (DE) ........................ 10 2004 023 416
May 27, 2004 (DE) ........................ 10 2004 025 878

(51) Int. Cl.
*G06F 3/042* (2006.01)
*G06M 7/00* (2006.01)
*G01J 1/36* (2006.01)

(52) U.S. Cl. ................. 250/227.22; 250/221; 345/175; 345/176

(58) Field of Classification Search ............... 250/221, 250/227.11, 227.22; 345/175, 176, 173
See application file for complete search history.

(56) References Cited

U.S. PATENT DOCUMENTS

| | | | |
|---|---|---|---|
| 4,340,813 A | * | 7/1982 | Sauer ........................ 250/221 |
| 4,405,197 A | | 9/1983 | Bejczy |
| 4,868,550 A | * | 9/1989 | Sasaki et al. ................ 345/175 |
| 5,103,085 A | * | 4/1992 | Zimmerman ................ 250/221 |
| 5,581,683 A | * | 12/1996 | Bertignoll et al. .......... 385/146 |
| 6,087,653 A | * | 7/2000 | Van Schyndel et al. 250/227.11 |

FOREIGN PATENT DOCUMENTS

| | | |
|---|---|---|
| DE | 29 36 815 A1 | 4/1981 |
| DE | 40 07 971 A1 | 9/1991 |
| DE | 197 00 836 C1 | 5/1998 |
| DE | 198 51 505 A1 | 5/2000 |
| DE | 102 11 307 A1 | 11/2003 |
| DE | 202 15 326 U1 | 4/2004 |
| EP | 0 446 642 A1 | 9/1991 |
| EP | 0 558 871 A1 | 9/1993 |
| EP | 1 406 387 A1 | 4/2004 |
| GB | 2 133 137 A | 7/1984 |
| GB | 2133137 A * | 7/1984 |
| WO | 04/018759 A1 | 3/2004 |

\* cited by examiner

*Primary Examiner*—Davienne Monbleau
*Assistant Examiner*—Brian J Livedalen
(74) *Attorney, Agent, or Firm*—Laurence A. Greenberg; Werner H. Stemer; Ralph E. Locher

(57) ABSTRACT

An infrared momentary-contact switch for a control device of a domestic appliance, has a transmitter which emits infrared radiation and a receiver which receives infrared radiation. The transmitter and receiver are disposed behind a cover through which at least some of the infrared radiation passes. In order to achieve a good ratio of useful signal to interference signal for the momentary-contact switch, the transmitter has an associated first optical fiber element and the receiver has an associated second optical fiber element. The ends of these optical fiber elements which respectively face away from the transmitter and receiver are adjacent one another and adjoin the cover. A control device is also provided.

15 Claims, 1 Drawing Sheet

TOUCH-SENSITIVE MOMENTARY-CONTACT SWITCH AND CONTROL DEVICE HAVING THE MOMENTARY-CONTACT SWITCH

BACKGROUND OF THE INVENTION

Field of the Invention

The present invention relates to a touch-sensitive momentary-contact switch and in particular to an infrared momentary-contact switch of this type for use in a control device for a domestic appliance. The momentary-contact switch includes a transmitter which emits electromagnetic radiation and a receiver which receives electromagnetic radiation. The transmitter and receiver are disposed behind a cover through which at least some of the electromagnetic radiation passes. The invention also relates to a control device having the momentary-contact switch.

The basic construction and fundamental principle of such a touch-sensitive momentary-contact switch are known from German Published, Non-Prosecuted Patent Application DE 40 07 971 A1. That touch-sensitive momentary-contact switch has a transmitter which emits electromagnetic radiation and a receiver which receives electromagnetic radiation. The transmitter and receiver are disposed behind a cover through which at least some of the electromagnetic radiation passes.

One example of an advantageous application of touch-sensitive momentary-contact switches of that type is their use in control devices for domestic appliances, such as cookers, glass-ceramic hobs, cook tops, microwave ovens and the like, in which the momentary-contact switch is provided behind a cover, for example a glass plate or glass-ceramic plate, so that it can be easily operated and cleaned.

In that context, German Published, Non-Prosecuted Patent Application DE 102 11 307 A1, corresponding to International Publication No. WO 03/076870 A1, for example, also discloses the transmitter and receiver having an associated optical waveguide, which either forms the cover itself or can be disposed behind a cover. The use of the optical waveguide increases the degrees of freedom for configuration of the optoelectronic components on a mounting board and also of the touch-panel on the cover with respect to momentary-contact switch fittings, which do not have optical waveguides.

German Utility Model DE 202 15 326 U1, which is owned by the corporate assignee of the instant application, also describes a touch-sensitive momentary-contact switch, which additionally has an indicating lamp. The indicating lamp can indicate to the user, for example, that the momentary-contact switch is ready for operation or is in operation.

SUMMARY OF THE INVENTION

It is accordingly an object of the invention to provide a touch-sensitive momentary-contact switch and a control device having the momentary-contact switch, which overcome the hereinafore-mentioned disadvantages of the heretofore-known devices of this general type and in which the momentary-contact switch has an improved ratio of useful signal to interference signal.

With the foregoing and other objects in view there is provided, in accordance with the invention, a touch-sensitive momentary-contact switch. The momentary-contact switch comprises a cover, a transmitter disposed behind the cover and emitting electromagnetic radiation, and a receiver disposed behind the cover and receiving electromagnetic radiation. At least some of the electromagnetic radiation passes through the cover. A first optical fiber element associated with the transmitter has an end facing away from the transmitter. A second optical fiber element associated with the receiver has an end facing away from the receiver. The ends of the first and second optical fiber elements are adjacent one another and adjoin the cover.

According to the present invention, the transmitter and the receiver of the touch-sensitive momentary-contact switch each have their own associated optical fiber element. This means that the light path between transmitter and cover and the light path between cover and receiver are decoupled. This prevents reflected radiation which is produced at a boundary layer between the first optical fiber element and the cover, by the radiation emitted by the transmitter, from passing to the receiver as interference light, since this reflected radiation cannot penetrate the second optical fiber element. The ratio of useful light to interference light in the momentary-contact switch is therefore efficiently improved.

A further advantage of the momentary-contact switch according to the invention is the increased freedom for configuration of the optoelectronic components and of the touch-panels on the cover. This is accomplished because the interposition of the first and second optical fiber elements means that the positions of the transmitter and receiver do not have to correspond to those of the touch-panel on the cover and any desired distances between the transmitter/receiver and the cover are possible in principle. It is not even absolutely necessary for the transmitter and the receiver of a momentary-contact switch to be disposed in such a way that they adjoin one another.

In accordance with another feature of the invention, the electromagnetic radiation used for the purposes of the present invention is preferably infrared radiation.

In accordance with a further feature of the invention, the first and second optical fiber elements are widened at their ends which respectively face away from the transmitter and receiver, as compared to their ends which respectively face toward the transmitter and receiver, so that a larger touch-panel can be provided on the cover.

In accordance with an added feature of the invention, there is provided a dark filter element disposed between the first and second optical fiber elements on one hand and the cover on the other hand. As an alternative or in addition thereto, the first and second optical fiber elements may also be darkened. This measure makes it possible for the momentary-contact switch to be indiscernible to the user when the appliance is switched off or when it is not ready for operation. As a result the appliance has a visually pleasing appearance.

In accordance with an additional feature of the invention, the first and second optical fiber elements extend substantially parallel to one another and/or extend substantially perpendicularly to the cover and rectilinearly between the cover and the transmitter or receiver, respectively. In principle, the two optical fiber elements may, however, be disposed in any desired manner in order to increase the degrees of freedom for configuration of the optoelectronic components and of the touch-panels on the cover. If the optical fiber elements are disposed parallel, they may be kept at a small distance from one another by providing the optical waveguides with small knobs or grooves (on an order of magnitude of, for example, 0.2 mm).

In accordance with yet another feature of the invention, the momentary-contact switch also has at least one indicating element which emits visible light and is associated with the first and/or with the second optical fiber element on that side of the optical fiber element which faces toward the respective transmitter or receiver. The at least one indicating element can indicate to a user, for example, that the momentary-contact switch is ready for operation or is in operation.

In accordance with yet a further feature of the invention, the at least one indicating element is, for example, a light-emitting diode which is preferably associated with both the first optical fiber element and the second optical fiber element by, for example, placing this at least one indicating element between the transmitter and the receiver. A plurality of identically colored or differently colored light-emitting diodes may also be provided.

In accordance with yet an added feature of the invention, the transmitter, the receiver and the at least one indicating element are preferably disposed on a common mounting board.

In accordance with yet an additional feature of the invention, the momentary-contact switch is preferably also surrounded by a screen for screening it from external light, at least in the region of the transmitter and of the receiver. This is done in order to further improve the ratio of useful light to interference light.

With the objects of the invention in view, there is also provided a control device for an electronic domestic appliance, such as a cooker, a microwave oven, a hob, a cook top, a washing machine, a tumble-dryer, a dishwasher and the like, having at least one touch-sensitive momentary-contact switch according to the invention. A plurality of touch-sensitive momentary-contact switches may also be combined to form a touch-operated element in this case.

Other features which are considered as characteristic for the invention are set forth in the appended claims.

Although the invention is illustrated and described herein as embodied in a touch-sensitive momentary-contact switch and a control device having the momentary-contact switch, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
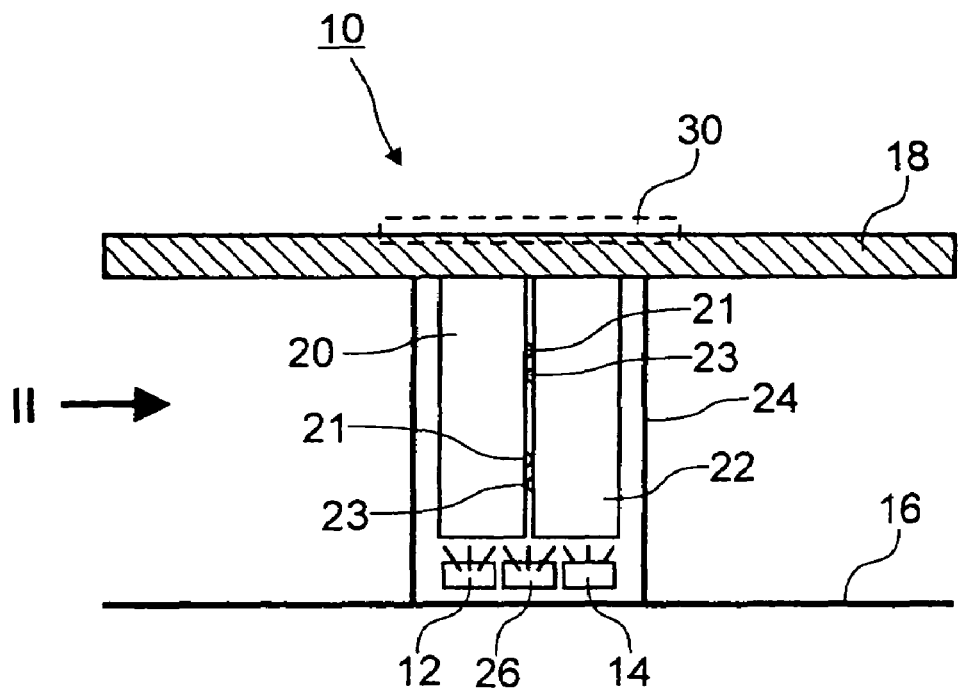
FIG. 1 is a diagrammatic and partly sectional, side-elevational view of a touch-sensitive momentary-contact switch according to a preferred exemplary embodiment of the present invention.
Figure 2:
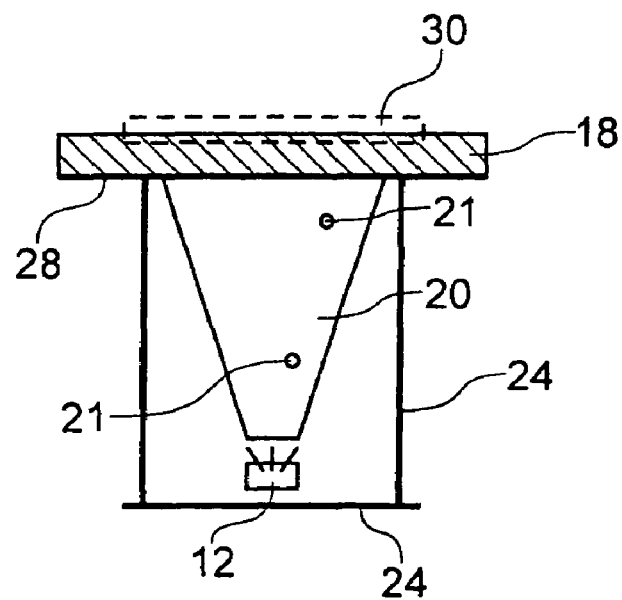
FIG. 2 is a partly sectional, side-elevational view, as seen in a direction II in FIG. 1, of a modification of the touch-sensitive momentary-contact switch of FIG. 1.

Referring now in detail to FIGS. 1 and 2 of the drawings as a whole, there is seen a preferred exemplary embodiment of a touch-sensitive momentary-contact switch according to the invention, which is explained below with reference to the figures by using the example of an infrared momentary-contact switch for a domestic appliance, such as a cooker, a microwave oven, a hob, a cook top, a washing machine, a tumble-dryer, a dishwasher or the like. However, the invention is not restricted to electromagnetic radiation of this wavelength range or to this specific application.

The touch-sensitive momentary-contact switch 10 has an infrared transmitter 12 and an infrared receiver 14 which are mounted on a mounting board 16 and disposed behind a cover 18 through which some of the infrared radiation passes, for example a glass plate or glass-ceramic plate. Although the transmitter 12 and the receiver 14 are disposed on the mounting board 16 in positions adjacent one other, the present invention is not restricted to this configuration and the transmitter 12 and the receiver 14 may instead in principle be positioned on the mounting board 16 independently of one another. It is also not absolutely necessary to place the transmitter 12 and the receiver 14 behind the cover 18 in a manner corresponding to a user touch-panel 30 on the cover 18, as shown in FIGS. 1 and 2. Instead, in principle it is possible to provide the transmitter and receiver at locations which are favorable for installation and likewise independently of the position of the touch-panel 30. Furthermore, the distance between the cover 18 and the transmitter 12 and the receiver 14 may in principle be chosen to be as small or as large as desired. This is particularly advantageous if the distance has to be chosen to be relatively large due, for example, to other components on the mounting board 16.

The infrared transmitter 12 has an associated first optical fiber element 20 having an end which faces away from the transmitter 12 and adjoins the cover 18. The infrared receiver 14 analogously has an associated second optical fiber element 22 having an end which faces away from the receiver 14 and likewise adjoins the cover 18. The optical fiber elements 20, 22 have side surfaces facing one another. Each of the side surfaces of the optical fiber elements 20, 22 which face the other respective optical fiber element 22, 20 have a number of knobs 21, 23 (which are visible through the optical fiber element 20 in FIG. 2). The knobs 21, 23 are made from the same material as the optical fiber elements 20, 22 and form a raised area of approximately 0.2 mm on the side surfaces of the optical fiber elements 20, 22 and thus separate these optical fiber elements, as a result of which undesirable optical coupling between the optical fiber elements 20, 22 is avoided.

Moreover, those ends of the first and second optical fiber elements 20 and 22 which face away from the respective transmitter 12 and receiver 14 are disposed adjacent one another. The light emitted by the transmitter 12 is emitted to the outside through the first optical fiber element 20 and the cover 18 and if a user has a finger on the cover 18 in the region of the touch-panel 30, this light is reflected by the finger and passed to the receiver 14 through the cover 18 and the second optical fiber element 22 in order to evaluate the signal.

Since the transmitter 12 and the receiver 14 of the momentary-contact switch 10 have two separate optical fiber elements 20 and 22, the light emitted by the transmitter 12 and reflected at a boundary layer between the first optical fiber element 20 and the cover 18 cannot reach the receiver 14 as interference light. A ratio of useful light to interference light in the momentary-contact switch 10 can thus be efficiently improved. Mutual interference between the light in the two optical fiber elements 20, 22 is precluded if the optical fiber elements are of adequate quality, and this may be additionally ensured by appropriate sheathing.

As can be seen in the side view shown in FIG. 2, those ends of the optical fiber elements 20 and 22 which face away from the respective transmitter 12 or receiver 14, are in each case widened as compared to the ends which face the respective transmitter or receiver. In this way, a relatively large touch-panel 30 can be produced on the cover 18, which is easy for the user to operate. In this case, the optical fiber elements 20, 22 are preferably constructed in such a way that the touch-panel 30 is illuminated as uniformly as possible. To this end, the optical waveguides may be formed to be complete or those ends of the optical fiber elements 20, 22 which face the cover 18 may be formed to be diffuse, for example roughened.

In the illustrated exemplary embodiment, the two optical fiber elements 20 and 22 extend substantially perpendicular to the cover 18, substantially parallel to one another, and substantially rectilinearly between the cover 18 and the respective transmitter 12 and receiver 14. However, the present invention is not restricted to only this configuration of the optical fiber elements. The first and second optical fiber elements 20 and 22 may instead be disposed independently of one another and in principle may follow any desired course. This increases the degree of freedom for a configuration of the optoelectronic components on the mounting board.

Although not illustrated, it is also possible for that end of the first optical fiber element 20 which faces the infrared transmitter 12 to have a radiation input element, and for that end of the second optical fiber element 22 which faces the infrared receiver 14 to have a radiation emitting element. This is done in order to optimize the coupling of the infrared radiation into the first optical fiber element 20 and, respectively, out of the second optical fiber element 22, and thus to increase the sensitivity of the momentary-contact switch 10.

As is shown in FIG. 2 in the modification of the first exemplary embodiment, a dark filter 28 may be provided between the cover 18 and the first and second optical fiber elements 20, 22. As an alternative or in addition thereto, the first and second optical fiber elements 20, 22 may also be darkened. This makes it possible for the momentary-contact switch 10 to be indiscernible to the user when the domestic appliance is switched off or when it is not ready for operation, and a visually pleasing appearance of the domestic appliance can therefore be achieved.

In order to further improve the ratio of useful light to interference light in the touch-sensitive momentary-contact switch 10, the momentary-contact switch 10 is surrounded by a screen 24, as shown in FIG. 1, in order to screen the momentary-contact switch 10 from the incidence of external light. In this case, the screen 24 should be provided at least in the region of the transmitter 12 and of the receiver 14.

The touch-sensitive momentary-contact switch 10 also has at least one light-emitting diode 26 for emitting visible light, as an indicating element of the invention. A plurality of selectively identically colored or differently colored light-emitting diodes 26 may also optionally be provided.

As is illustrated in FIG. 1, the at least one light-emitting diode 26 is mounted between the infrared transmitter 12 and the infrared receiver 14 on the common mounting board 16, in such a way that the at least one light-emitting diode 26 is associated with both the first optical fiber element 20 and the second optical fiber element 22 and in such a way that the visible light emitted by the at least one light-emitting diode 26 is transmitted to the outside through the two optical fiber elements 20, 22 and through the cover 18. If there are two or more light-emitting diodes 26, one light-emitting diode 26 may also emit light in each respective one of the optical fiber elements 20, 22.

This configuration of the at least one light-emitting diode or indicating element 26 makes it possible, for example, to illuminate the momentary-contact switch 10 or the touch-panel 30 on the cover 18 from the rear and thus make it visible and identifiable to the user. It is possible in this way, for example, to indicate through the use of a red light that the momentary-contact switch 10 is ready for operation, and operation of the momentary-contact switch 10 by the user is then indicated through the use of a green light. In this case, the momentary-contact switch 10 can advantageously be seen by the user only when the domestic appliance is switched on or when the momentary-contact switch 10 is ready for operation, as mentioned above.

The light-emitting diode 26 between the transmitter 12 and the receiver 14 also provides additional screening between these two components, in such a way that light emitted by the transmitter 12 cannot directly reach the receiver 14 as interference light. The ratio of useful light to interference light in the momentary-contact switch 10 is thus improved further. In one embodiment of the momentary-contact switch 10 in which no indicating element 26 is disposed between the transmitter 12 and the receiver 14, a suitable screen element may be provided in its place, for the purpose of screening between the transmitter and receiver and in order to achieve the above-mentioned effect.

This application claims the priority, under 35 U.S.C. § 119, of German Patent Application Nos. 10 2004 023 416.7, filed May 12, 2004 and 10 2004 025 878.3, filed May 27, 2004; the entire disclosures of the prior applications are herewith incorporated by reference.

I claim:

1. A touch-sensitive momentary-contact switch, comprising:
   a cover;
   a transmitter disposed behind said cover and emitting electromagnetic radiation;
   a receiver disposed behind said cover and receiving electromagnetic radiation;
   at least some of the electromagnetic radiation passing through said cover;
   a first optical fiber element associated with said transmitter and having an end facing away from said transmitter;
   a second optical fiber element associated with said receiver and having an end facing away from said receiver;
   said ends of said first and second optical fiber elements being adjacent one another and adjoining said cover;
   each of said first and second optical fiber elements having an end facing toward a respective one of said transmitter and said receiver; and
   at least one indicating element emitting visible light being associated with said end of at least one of said first and second optical fiber elements facing toward a respective one of said transmitter and said receiver, said at least one indicating element being associated with both said first optical fiber element and said second optical fiber element.

2. The momentary-contact switch according to claim 1, wherein the electromagnetic radiation is infrared radiation.

3. The momentary-contact switch according to claim 1, wherein:
   said first optical fiber element has an end facing toward said transmitter;
   said second optical fiber element has an end facing toward said receiver; and said ends of said first and second optical fiber elements respectively facing away from said transmitter and said receiver being wider than said ends of said first and second optical fiber elements respectively facing toward said transmitter and said receiver.

4. The momentary-contact switch according to claim 1, which further comprises a dark filter element disposed between said first and second optical fiber elements and said cover.

5. The momentary-contact switch according to claim 1, wherein at least one of said optical fiber elements is darkened.

6. The momentary-contact switch according to claim 1, wherein said first and second optical fiber elements extend substantially parallel to one another.

7. The momentary-contact switch according to claim 1, wherein said first and second optical fiber elements each extend substantially perpendicularly to said cover and substantially rectilinearly between said cover and a respective one of said transmitter and said receiver.

8. The momentary-contact switch according to claim 1, wherein said at least one indicating element is a light-emitting diode.

9. The momentary-contact switch according to claim 1, wherein said at least one indicating element is disposed between said transmitter and said receiver.

10. The momentary-contact switch according to claim 1, wherein said at least one indicating element is a plurality of identically colored indicating elements.

11. The momentary-contact switch according to claim 1, wherein said at least one indicating element is a plurality of differently colored indicating elements.

12. The momentary-contact switch according to claim 1, which further comprises a mounting board on which said transmitter, said receiver and said at least one indicating element are disposed in common.

13. The momentary-contact switch according to claim 1, which further comprises a screen for screening external light, said screen surrounding at least the vicinity of at least one of said transmitter and said receiver.

14. A control device for an electronic domestic appliance, the control device comprising:
    at least one touch-sensitive momentary-contact switch according to claim 1.

15. The control device according to claim 14, wherein a plurality of said touch-sensitive momentary-contact switches are combined to form a touch-operated element.

* * * * *